US009173335B2

(12) United States Patent
Chen et al.

(10) Patent No.: US 9,173,335 B2
(45) Date of Patent: Oct. 27, 2015

(54) COMPLEX CIRCUIT BOARD FABRICATION METHOD

(71) Applicant: AU Optronics Corporation, Hsin-Chu (TW)

(72) Inventors: Ching-Feng Chen, Hsin-Chu (TW); Cheng-Min Tsai, Hsin-Chu (TW); Cheng-Yu Wang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 17 days.

(21) Appl. No.: 14/144,471

(22) Filed: Dec. 30, 2013

(65) Prior Publication Data

US 2014/0109403 A1 Apr. 24, 2014

Related U.S. Application Data

(62) Division of application No. 13/053,536, filed on Mar. 22, 2011, now Pat. No. 8,641,260.

(30) Foreign Application Priority Data

Oct. 25, 2010 (TW) .............................. 99136376 A

(51) Int. Cl.
| | |
|---|---|
| *H05K 13/04* | (2006.01) |
| *H05K 13/00* | (2006.01) |
| *H05K 1/14* | (2006.01) |
| *H05K 3/22* | (2006.01) |
| *H05K 3/36* | (2006.01) |
| *H05K 1/02* | (2006.01) |

(52) U.S. Cl.
CPC ............ *H05K 13/0023* (2013.01); *H05K 1/147* (2013.01); *H05K 3/22* (2013.01);
(Continued)

(58) Field of Classification Search
CPC ....... H05K 1/142; H05K 1/147; H05K 1/148; H05K 13/0023; H05K 1/028; H05K 3/22; H05K 3/363; H05K 2201/056; H05K 2201/09063; H05K 2201/10106; Y10T 29/4913; Y10T 29/49126; Y10T 29/49144
USPC ........................................... 29/832, 846, 852
See application file for complete search history.

(56) References Cited

U.S. PATENT DOCUMENTS

| 5,297,968 A | 3/1994 | Johnson et al. |
| 5,358,412 A | 10/1994 | Maurinus et al. |

(Continued)

FOREIGN PATENT DOCUMENTS

| CN | 200962689 Y | 10/2007 |
| DE | 3223832 A * | 12/1983 |

(Continued)

OTHER PUBLICATIONS

English translation of abstract of CN 200962689 Y (published Oct. 17, 2007).
China Office Action dated Nov. 1, 2011.

*Primary Examiner* — Carl Arbes
(74) *Attorney, Agent, or Firm* — McClure, Qualey & Rodack, LLP

(57) ABSTRACT

A complex circuit board including a printed circuit board assembly (PCBA) and a flexible printed circuit (FPC) for providing driving signals for light sources is disclosed. The PCBA includes a supporting portion and a connecting portion. The light sources are disposed above the supporting portion. The connection portion contacts electrically with a contacting portion of the FPC. The contacting portion of the FPC has a fixing hole. The connecting portion of the PCBA has a fixing portion. Moreover, the FPC has two or more than two first bend portions on the contacting portion. The fixing portion of the PCBA is inserted into the fixing hole of the FPC to complete the complex circuit board without extra attachment units. Therefore, the assembly procedure is simplified to increase throughput and the cost is reduced.

8 Claims, 9 Drawing Sheets

(52) U.S. Cl.
CPC ............... *H05K 3/363* (2013.01); *H05K 1/028* (2013.01); *H05K 2201/056* (2013.01); *H05K 2201/09063* (2013.01); *H05K 2201/10106* (2013.01); *Y10T 29/4913* (2015.01); *Y10T 29/49126* (2015.01); *Y10T 29/49144* (2015.01)

(56) References Cited

U.S. PATENT DOCUMENTS

| | | |
|---|---|---|
| 5,920,465 A | 7/1999 | Tanaka |
| 6,342,932 B1 | 1/2002 | Terao et al. |
| 6,452,754 B1 | 9/2002 | Mizuta et al. |
| 7,887,210 B2 | 2/2011 | Kim |
| 8,172,417 B2 | 5/2012 | Baar |
| 8,212,961 B2 | 7/2012 | Kim |
| 8,264,654 B2 | 9/2012 | Lee |
| 2005/0259387 A1 | 11/2005 | Sung et al. |

FOREIGN PATENT DOCUMENTS

| | | | |
|---|---|---|---|
| DE | 3223857 A | * | 12/1983 |
| TW | 200539781 | | 12/2005 |

* cited by examiner

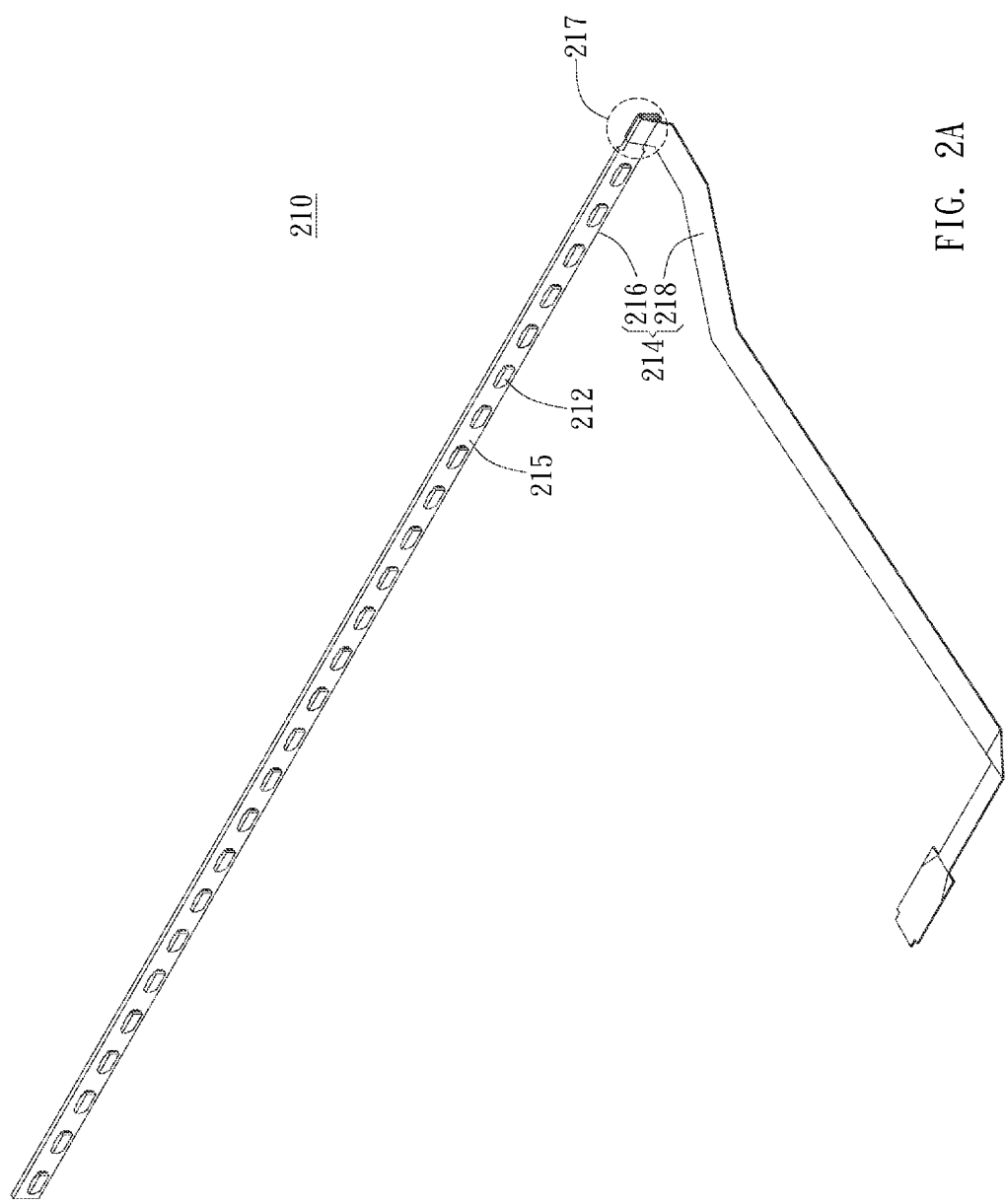

COMPLEX CIRCUIT BOARD FABRICATION METHOD

BACKGROUND OF THE INVENTION

1. Field of the Invention

The present invention generally relates to a complex circuit board and a fabrication method thereof, particularly to a technology of combining circuit boards using corresponding fixing structures thereof to form the complex circuit board without extra attachment units.

2. Description of the Prior Art

Various display electronic products have been developed in recent years. Among various types of flat displays, liquid crystal displays (LCD) have become the mainstream products, for example, LCD TVs and computer LCD monitors.

FIG. 1 is a schematic view of a conventional liquid crystal apparatus. A display apparatus 1 has a display panel 100 and a backlight module 200. The backlight module 200 has a light-emitting device 210. The light-emitting device 210 supplies backlight for the display panel 100. Therefore the display apparatus 1 displays full color image for viewers.

FIG. 2A is a schematic view of the light-emitting device 210. The light-emitting device 210 has light sources 212 and circuit boards 214. The circuit boards 214 transmit signals to the light sources 212 to control the power or the brightness of light sources 212. Light emitting diodes (LEDs) could be used as the light sources 212. The circuit boards 214 include a printed circuit board assembly (PCBA) 216 and a flexible printed circuit (FPC) 218 combined with each other. The printed circuit board assembly 216 has a supporting surface 215 and the light sources 212 are disposed on the supporting surface 215. The printed circuit board assembly 216 has a combining section 217 for attaching a bend portion of the flexible printed circuit 218 onto the printed circuit board assembly 216 and electrically transmitting driving signals of light sources.

FIG. 2B illustrates a combining method for the circuit boards 214 of the conventional display apparatus 1. The flexible printed circuit 218 is bent and attached onto the printed circuit board assembly 216, wherein attachment units 219 (e.g. tapes) are attached onto the combining section 217, thereby strengthening the pull strength of flexible printed circuit 218 and reducing the possibility of poor signal transmission induced by the stress acting on the combining section 217. However, the above combining method needs additional processes for attaching the attachment units 219 to strengthen the combining portion 217. Furthermore, the ability of the attachment units 219 in strengthening the pull strength of the combining section 217 is limited. For large-size display application, the combining strength of circuit boards 214 should be further improved.

SUMMARY OF THE INVENTION

It is an object of the present invention to provide a complex circuit board which combines a printed circuit board assembly and a flexible printed circuit.

It is another object of the present invention to provide a complex circuit board to improve the pull strength of a flexible printed circuit.

It is a further object of the present invention to provide a complex circuit board without extra attachment units on the combining sections of circuit boards.

It is yet another object of the invention to provide a display apparatus, including a display panel and a backlight module. A light-emitting device of the backlight module supplies backlight for the display panel. The light-emitting device has light sources and circuit boards. The circuit boards transmit control signals to the light sources to control power and brightness of the light sources. The complex circuit board includes a printed circuit board assembly (PCBA) and a flexible printed circuit (FPC).

The printed circuit board assembly has a supporting section and a connecting section. The supporting section has a supporting surface for supporting the light sources. The connection section extends from the one side of the supporting section and has a first surface extending from the supporting surface, a first side surface adjacent to the first surface, and a first fixing portion disposed on the first side surface. The flexible printed circuit has a contacting section disposed parallel to the connecting section. The contacting section has a first fixing hole and the first fixing portion is inserted into the first fixing hole to couple the flexible printed circuit with the printed circuit board assembly.

Furthermore, the flexible printed circuit has a first bend portion and a second bend portion. The first bend portion and the second bend portion are located on two opposite sides of the contacting section. The flexible printed circuit changes the extending direction at the first bend portion and has an angle with the contacting section, wherein the first fixing hole is located on the first bend portion.

The printed circuit board assembly further has a first connecting unit disposed on the connecting section. The flexible printed circuit has a second connecting unit disposed on the contacting section. The second connecting unit is electrically connected to the first connecting unit to transmit control signals of the light sources.

It is another object of the present invention to provide a fabrication method of a complex circuit board. The method includes forming a first fixing portion on a printed circuit board assembly and a first fixing hole on a flexible printed circuit. The first fixing hole is corresponding to the first fixing unit and the first fixing unit is inserted into the first fixing hole to couple the flexible printed circuit with the printed circuit board assembly to accomplish the fixing process of the circuit boards.

By the above complex circuit board and the fabrication method, the strength of fixing the printed circuit board assembly and the flexible printed circuit is improved to effectively increase the pull strength therebetween. Moreover, without using extra attachment units (e.g. tapes), the assembly procedure is simplified. Consequently, the throughput is increased and the cost is reduced.

BRIEF DESCRIPTION OF THE DRAWINGS

FIG. 2A is a schematic view of a conventional light-emitting module.

DETAILED DESCRIPTION OF THE PREFERRED EMBODIMENT

The present invention provides a complex circuit board and a fabrication method thereof by using mechanical-combining technique to effectively increase the pull strength of the complex circuit board and strengthen the connection of a printed circuit board assembly and a flexible printed circuit. Furthermore, the elimination of the conventional step of attaching attachment units simplifies the assembly procedure and reduces the cost of attachment units. The complex circuit board of the present invention and a fabrication method thereof can achieve the advantages of improving the strength of the complex circuit board and reducing the product cost.

Figure 1:
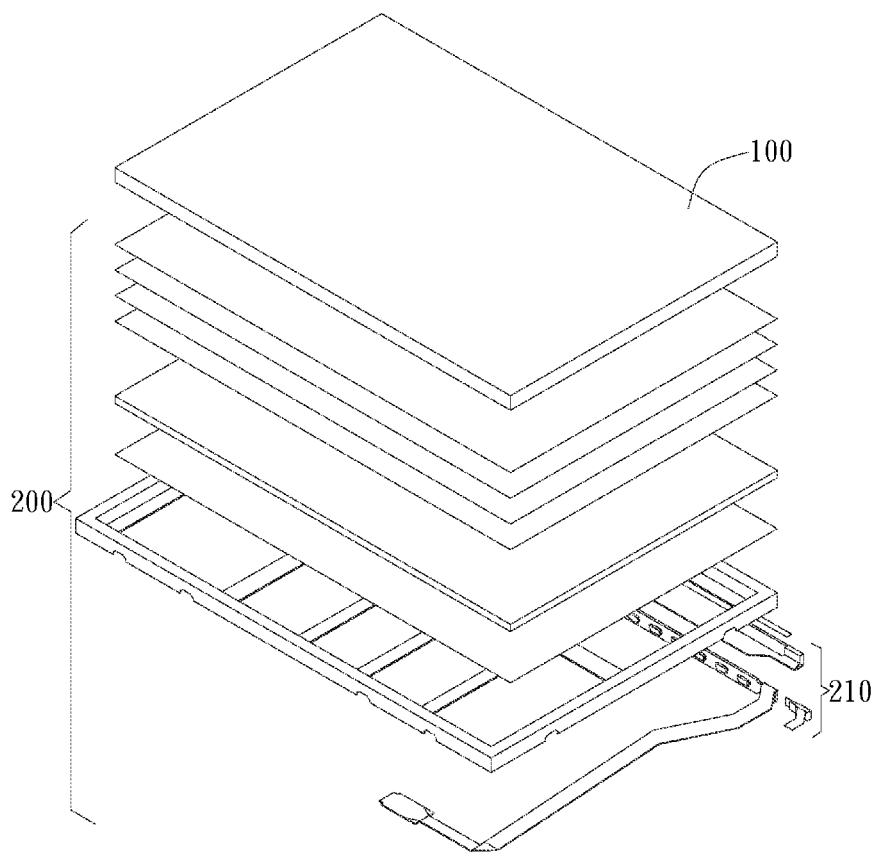
FIG. 1 is a schematic view of a conventional display apparatus.
Figure 2B:
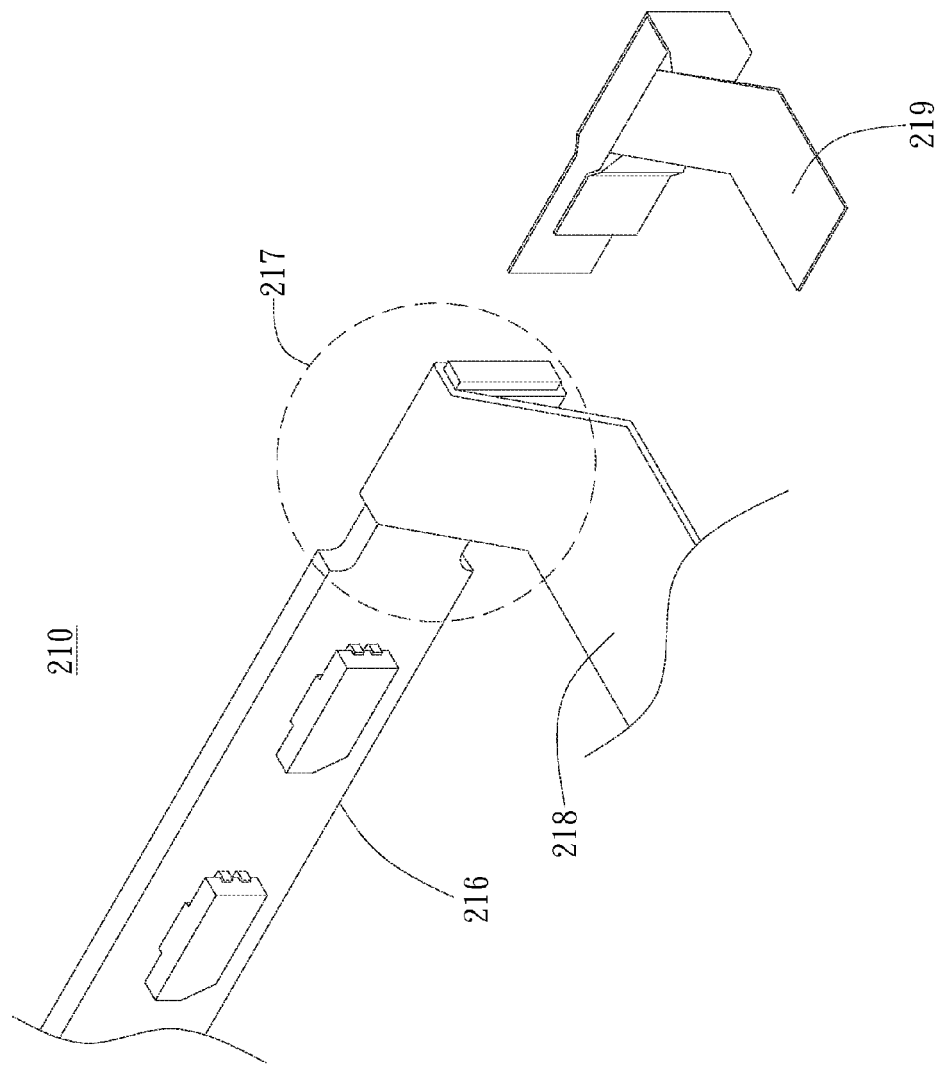
FIG. 2B is a schematic view showing the assembly of the conventional light-emitting module.
Figure 3A:
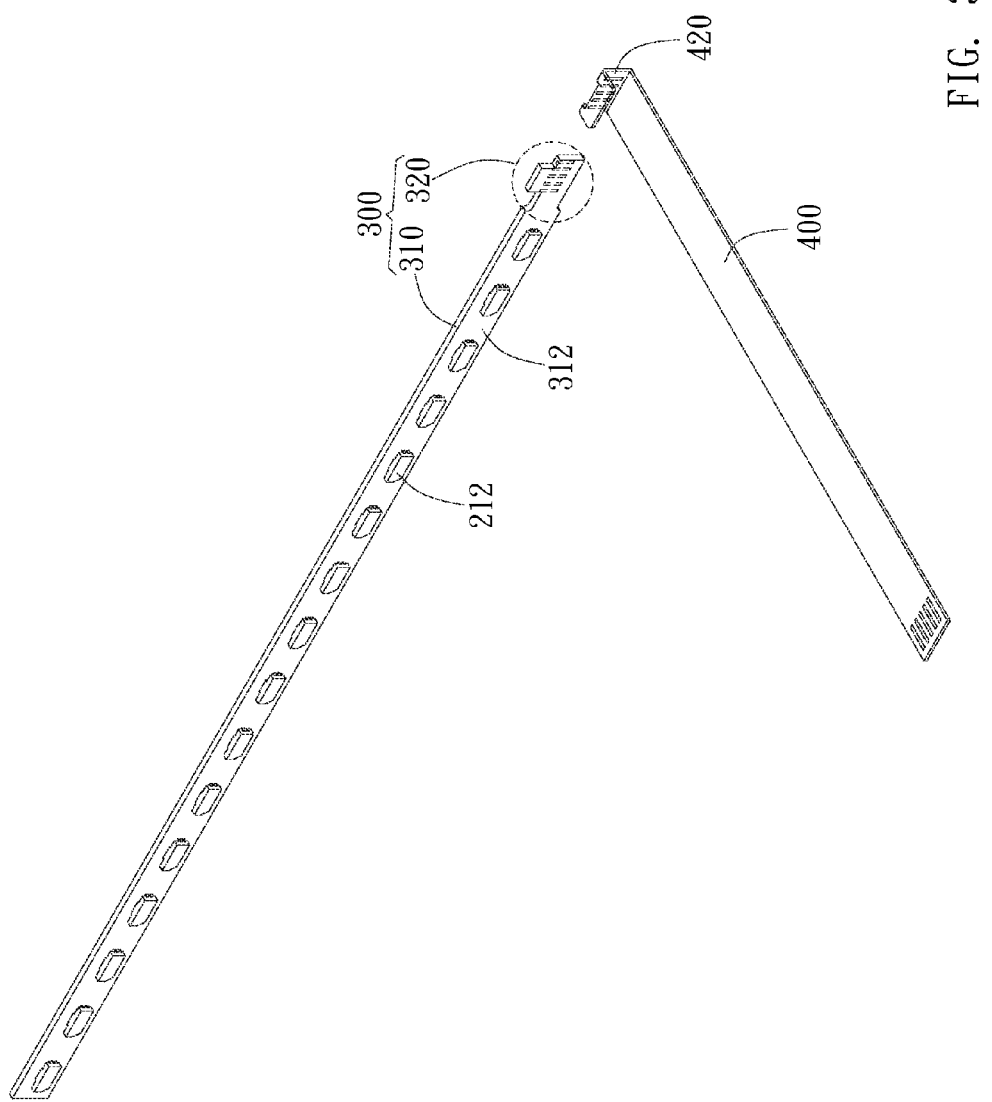
FIG. 3A is a schematic view of the light-emitting module of the present invention.

As shown in FIG. 3A, the complex circuit board includes a printed circuit board assembly 300 and a flexible printed circuit 400. The printed circuit board assembly 300 has a supporting section 310 and a connecting section 320. The supporting section 310 supports several light sources 212. Specifically, the supporting section 310 has a supporting surface 312 and the light sources 212 are disposed on the supporting surface 312. The light sources 212 are preferably light emitting diodes (LEDs) for supplying illumination. The connecting section 320 extends from one end of the supporting section 310 and is provided for fixing and electrically connecting with the flexible printed circuit 400. The flexible printed circuit 400 is preferably formed by cutting from a flexible circuit board and has a contacting section 420. The contacting section 420 of the flexible printed circuit 400 is disposed corresponding to the connecting section 320 of the printed circuit board assembly and electrically connected thereto to transmit control signals of the light sources 212.

Figure 3B:
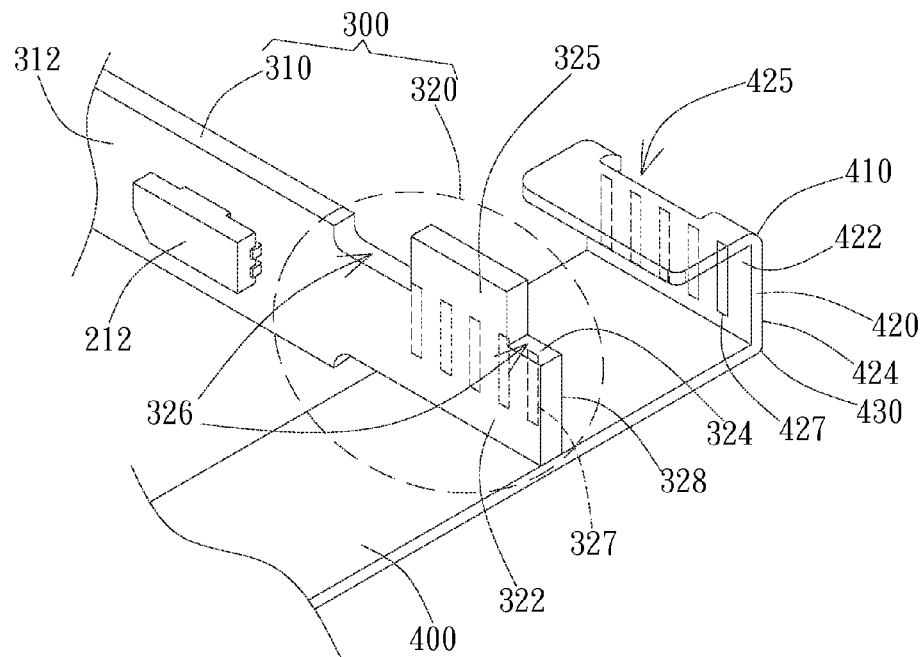
FIG. 3B is a schematic view showing the structure of the complex circuit board of the present invention.

FIG. 3B is a partially enlarged view of the complex circuit board. The connecting section 320 of the printed circuit board assembly 300 extends form the end of supporting section 310. The connecting section 320 has a first surface 322 extending from the supporting surface 312 and a first side surface 324 adjacent to the first surface 322. A first fixing portion 325 is disposed on the first side surface 324. In the present embodiment, the first fixing portion 325 is a protrusion on the first side surface 324. The connecting section 320 further includes a second surface 328 corresponding or opposite to the first surface 322, preferably parallel to the first surface 322. The first side surface 324 is situated between the first surface 322 and the second surface 328 and approximately perpendicular to the first surface 322 and the second surface 328. A first connecting unit 327 is disposed on the connecting section 320 and correspondingly adjacent to the first fixing portion 325. In the present embodiment, the first connecting unit 327 is disposed on the second surface 328 and can be, for example, electrical conductive patterns or contact pads to transmit control signals of the light sources 212. The material of the first connecting unit 327 is preferably copper, aluminum or alloys thereof.

The contacting section 420 of the flexible printed circuit 400 has a second connecting unit 427. The contacting section 420 has a third surface 422 and a fourth surface 424 opposite to the third surface 422, wherein the second connecting unit 427 can be disposed on the third surface 422 or the fourth surface 424. In the present embodiment, the second connecting unit 427 is disposed on the third surface 422. The second connecting unit 427 can be electrical conductive patterns or contact pads and the material can be copper, aluminum or alloys thereof. When the third surface 422 of the contacting section 420 and the second surface 328 of the connecting section 320 are correspondingly disposed, the second connecting unit 427 is electrically connected to the first connecting unit 327 of the printed circuit board assembly 300. For example, the second connecting unit 427 can be soldered to the first connecting unit 327 using a hot bar process or electrically connected to the first connecting unit 327 by a thermal press process. A first fixing hole 425 is located between the second connecting unit 427 and the end of flexible printed circuit 400. The first fixing portion 325 is inserted into the first fixing hole 425 to couple the printed circuit board assembly 300 and the flexible printed circuit 400. After the printed circuit board assembly 300 and the flexible printed circuit 400 are combined, the extending directions of the circuit boards 300, 400 are approximately perpendicular to each other.

Figure 3C:
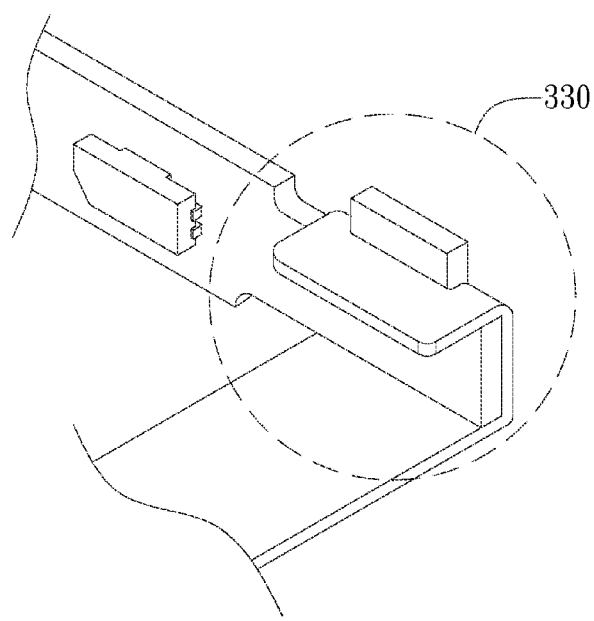
FIG. 3C is a combined view of the complex circuit board of the present invention.

Referring to FIG. 3C, the first fixing portion 325 is inserted into the first fixing hole 425 to assemble the printed circuit board assembly 300 with the flexible printed circuit 400 and electrically connect the first connecting unit 327 and the second connecting unit 427.

As shown in the FIG. 3B and FIG. 3C, the flexible printed circuit 400 is bent to form a first bend portion 410 and a second bend portion 430. The extending direction of the flexible printed circuit 400 is changed via the first bend portion 410 and the second bend portion 430 from the contacting section 420. The first bend portion 410 and the second bend portion 430 respectively have a bending angle. For example, the bending angle is 90 degrees or other specific degrees modulated according to the product design. In other words, the first bend portion 410 and the second bend portion 430 are located on two opposite sides of the contacting section 420.

Furthermore, as shown in FIG. 3B and FIG. 3C, a first indentation 326 is preferably formed on the connecting section 320 and disposed on at least one side of the first fixing portion 325. In the present embodiment, the first indentations 326 are disposed on two opposite sides of the first fixing portion 325. The first indentation 326 at least partially accommodates the first bend portion 410 of the flexible printed circuit 400. When combining the complex circuit board, the strength of the combining section 330 is improved and the smoothness of the complex circuit board is promoted. Similarly, another indentation can be disposed on the other side surface opposite to the first fixing portion 325 to at least partially accommodate the second bend portion 430 of the flexible printed circuit 400.

By means of the above structural design, the pull strength of the complex circuit board is structurally enhanced without using extra attachment units on the combining portion 330 and the assembly of the complex circuit board is easily accomplished.

Figure 4A:
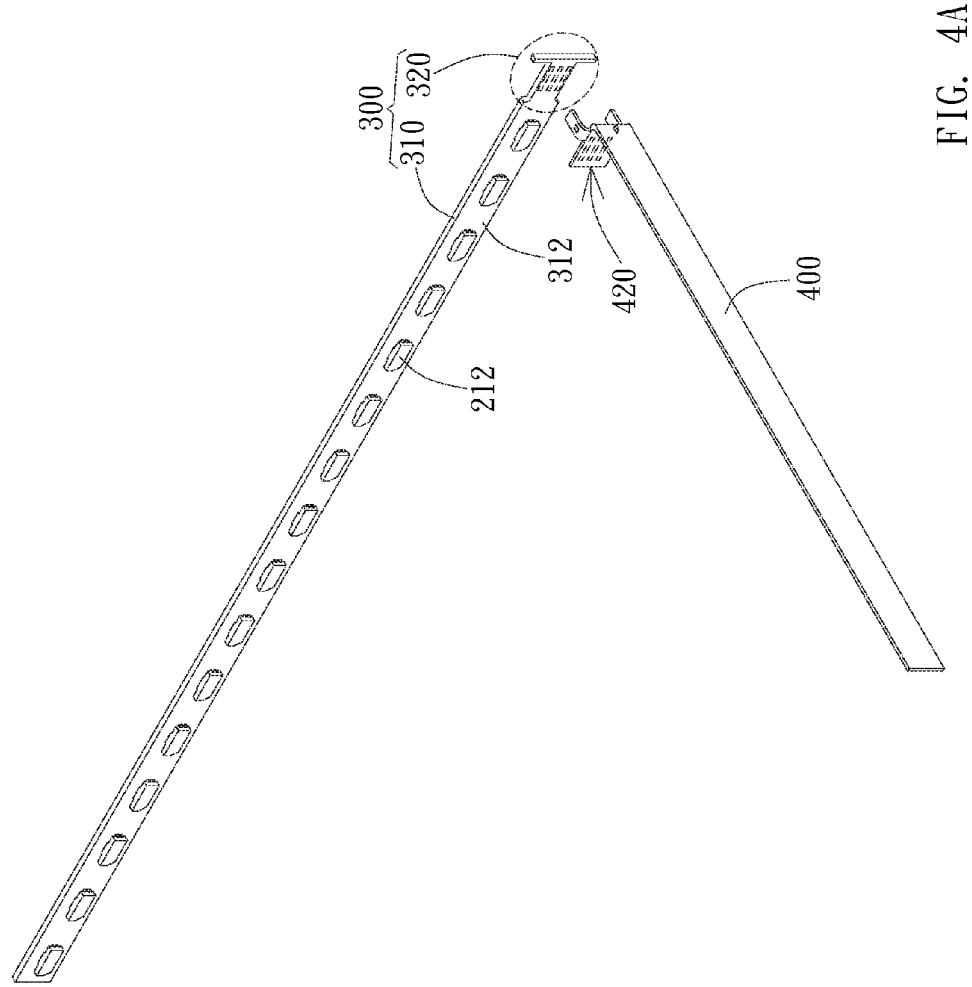
FIG. 4A is another embodiment of the light-emitting module.
Figure 4B:
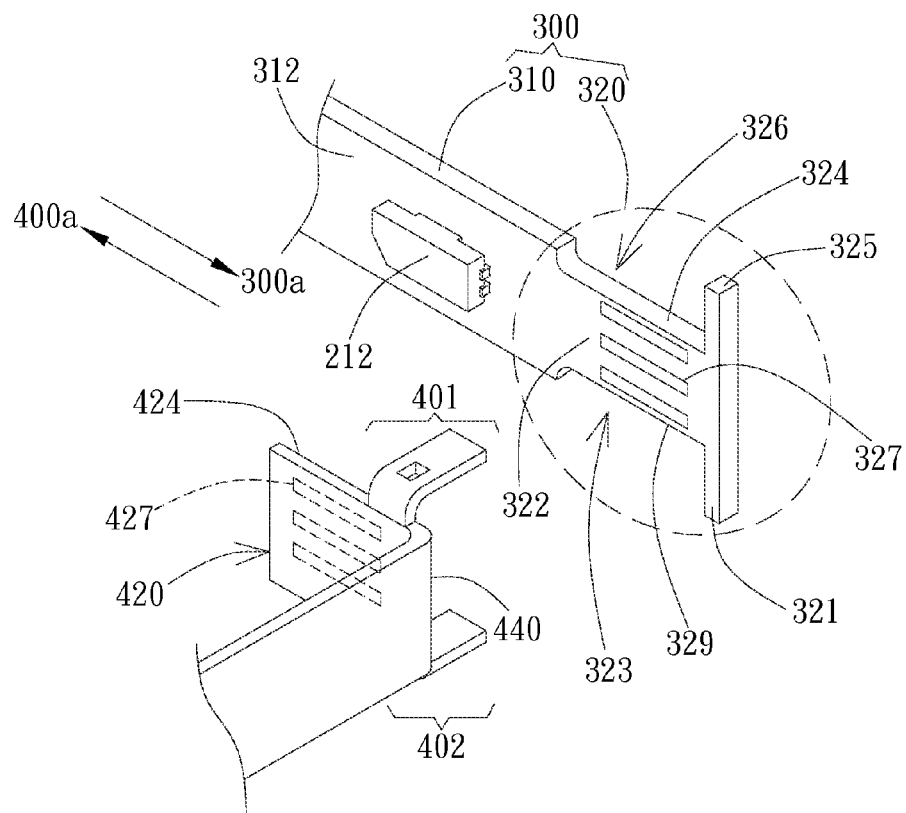
FIG. 4B is another embodiment of the complex circuit board.
Figure 4C:
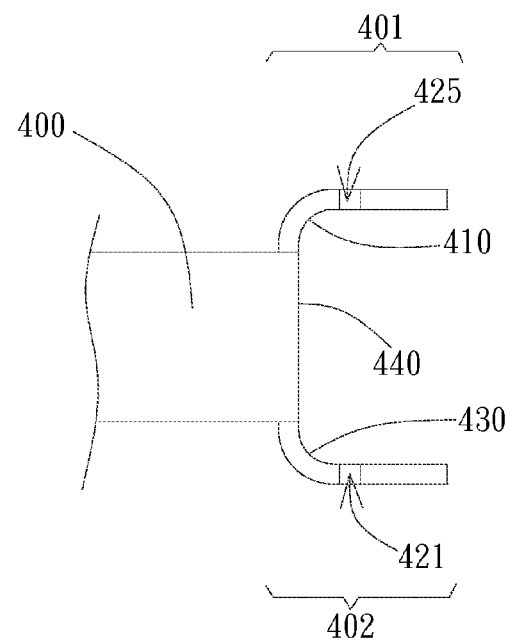
FIG. 4C is a combined view of another embodiment of the complex circuit board.

As shown in FIG. 4A to FIG. 4C, the present invention provides another embodiment, wherein the elements with same reference numbers are the same as those disclosed in the previous embodiment. As shown in FIG. 4A, the complex circuit board includes a printed circuit board assembly 300 and a flexible printed circuit 400. The printed circuit board assembly 300 has a supporting section 310 and a connecting section 320. The supporting section 310 supports several light sources 212. Specifically, the supporting section 310 has a supporting surface 312 and the light sources 212 are disposed on the supporting surface 312. The light sources 212 preferably include light emitting diodes (LEDs) for supplying illumination. The connecting section 320 extends from one end of the supporting section 310 and is provided for fixing and electrically connecting with the flexible printed circuit 400.

The flexible printed circuit 400 is preferably formed by cutting from a flexible circuit board and has a contacting section 420. The contacting section 420 of the flexible printed circuit 400 is disposed correspondingly to and electrically connected with the connecting section 320 of the printed circuit board assembly 300 to transmit control signals of the light sources 212.

FIG. 4B is a partially enlarged view of the complex circuit board. The connecting section 320 of the printed circuit board assembly 300 extends form the end of the supporting section 310. The connecting section 320 has a first surface 322 extending from the supporting surface 312 and a first side surface 324 adjacent to the first surface 322. A first fixing portion 325 is disposed on the first side surface 324. In the present embodiment, the first fixing portion 325 is a protrusion on the first side surface 324. A first connecting unit 327 is disposed on the first surface 322 of the connecting section 320 and adjacent to the first fixing portion 325. In the present embodiment, the second side surface 329 is parallel to the first side surface 324. A second fixing portion 321 is disposed on the second side surface 329 and is preferably a protrusion on the second side surface 329. In the present embodiment, the protrusions of first fixing portion 325 and second fixing portion 321 are symmetrically located on two opposite sides of the first connecting unit 327. The protrusion of first fixing portion 325 or second fixing portion 321 can be aligned to the first connecting unit 327, but not limited thereto. That is, the protrusion of first fixing portion 325 or second fixing portion 321 can be not aligned to the first connecting unit 327. The first connecting unit 327 is electrical conductive patterns or contact pads for transmitting control signals of the light sources 212. The most common material of the first connecting unit 327 is copper, aluminum or alloys thereof.

The contacting section 420 of the flexible printed circuit 400 has a second connecting unit 427. The second connecting unit 427 is disposed on the fourth surface 424. The second connecting unit 427 can be electrical conductive patterns or contact pads and the material is copper, aluminum or alloys thereof. When the fourth surface 424 of the contacting section 420 and the first surface 322 of the connecting section 320 are correspondingly disposed, the second connecting unit 427 is electrically connected to the first connecting unit 327 of the printed circuit board assembly 300. For example, the second connecting unit 427 can be soldered to the first connecting unit 327 using a hot bar process or electrically connected to the first connecting unit 327 by a thermal press process. The contacting section 420 of the flexible printed circuit 400 further includes a first hook 401 and a second hook 402. A first fixing hole 425 and a second fixing hole 421 are disposed on the first hook 401 and the second hook 402, respectively. The first hook 401 and the second hook 402 are bent to form a first bend portion 410 and a second bend portion 430. The first fixing portion 325 is inserted into the first fixing hole 425 and the second fixing portion 321 is inserted into the second fixing hole 421 to couple and fix the printed circuit board assembly 300 and the flexible printed circuit 400. After the printed circuit board assembly 300 and the flexible printed circuit 400 are combined, the extending directions (300a, 400a, see FIG. 4B) of the circuit boards 300, 400 are approximately parallel.

Finally, the flexible printed circuit 400 is bent to form a third bend portion 440. The extending direction of the flexible printed circuit 400 is changed via the third bend portion 440. The third bend portion 440 has a bending angle. The bending angle can be a specific degree modulated according to the product design.

In the present embodiment, the first bend portion 410 and the second bend portion 430 of the contacting section 420 are symmetrically disposed on two opposite sides of the second connecting unit 427. The first hook 401 or the second hook 402 can be aligned or not aligned with the second connecting unit 427.

A first indentation 326 and a second indentation 323 are disposed on one side of the first fixing portion 325 and the second fixing portion 321, respectively. The first indentation 326 is disposed between the first fixing portion 325 and the supporting section 310. The second indentation 323 is disposed between the second fixing portion 321 and the supporting section 310. The first indentation 326 and the second indentation 323 at least partially accommodate the first bend portion 410 and the second bend portion 430 of the flexible printed circuit 400, respectively. Therefore, the strength of the complex circuit board is improved due to the structural design.

Figure 5A:
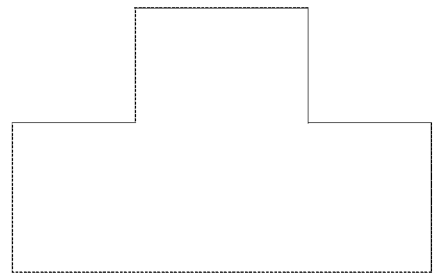
FIGS. 5A-5C are embodiments of fixing structures.
Figure 5B:
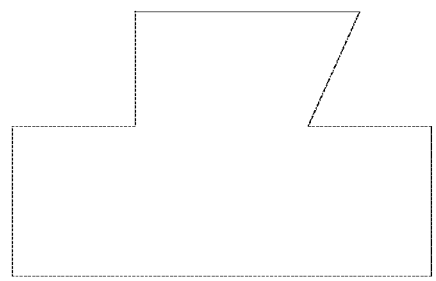
Figure 5C:
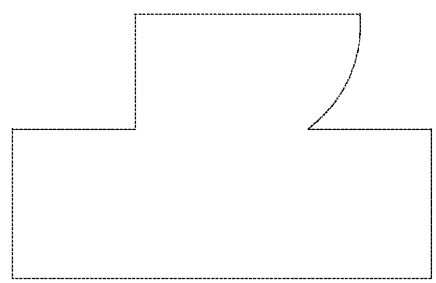

Moreover, as shown in FIG. 5A to FIG. 5C, to enhance the strength of the combining section 330, the first fixing portion 325 and the second fixing portion 321 can be rectangle, wedge, or arc shaped protrusions, so that the flexible printed circuit 400 and the printed circuit board assembly 300 are prevented from being detached from each other.

Figure 6:
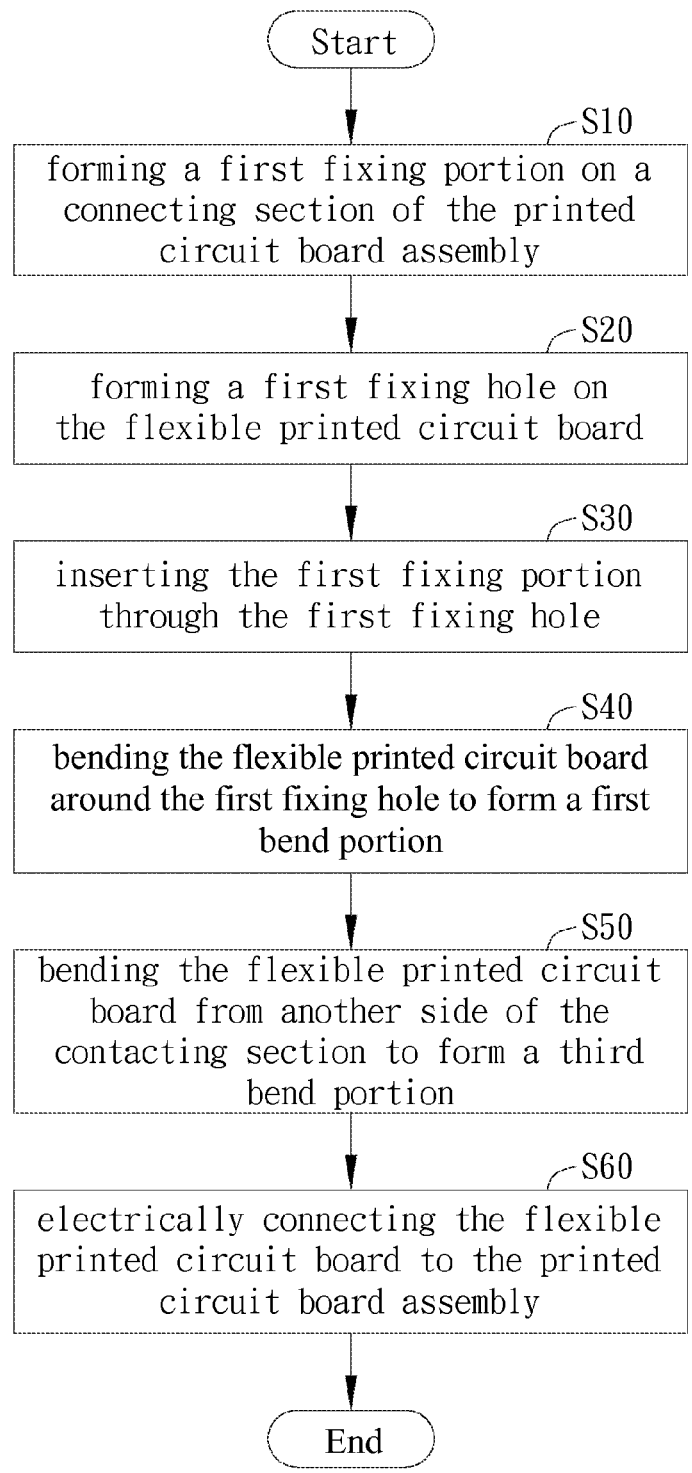
FIG. 6 is a flow chart of the fabrication method for the complex circuit board of the present invention.

The present invention also provides a fabrication method of the complex circuit board. As shown in FIG. 6, the step S10 is forming a first fixing portion 325 on a connecting section 320 of a printed circuit board assembly 300. In another embodiment, a second fixing portion 321 is further formed on the printed circuit board assembly 300. The step S10 further includes forming a first indentation 326 and a second indentation 323 on one side of the first fixing portion 325 and the second fixing portion 321, respectively.

The step S20 includes forming a first fixing hole 425 on a contacting section 420 of the flexible printed circuit 400. The first fixing hole 425 corresponds to the first fixing portion 325. In another embodiment, a second fixing hole 421 is formed on the flexible printed circuit 400 and the second fixing hole 421 is disposed corresponding to the second fixing portion 321.

The step S30 includes inserting the first fixing portion 325 into the first fixing hole 425 and inserting the second fixing portion 321 into the second fixing hole 421 to combine the flexible printed circuit 400 and the printed circuit board assembly 300.

The step S40 includes bending the flexible printed circuit 400 at the first fixing hole 425 to form the first bend portion 410. In another embodiment, the first hook 401 with the first fixing hole 425 and the second hook 402 with the second fixing hole 421 are bent to form the first bend portion 410 and the second bend portion 430 of the flexible printed circuit 400. The first bend portion 410 is parallel to the second bend portion 430. The first indentation 326 and the second indentation 323 at least partially accommodate the first bend portion 410 and the second bend portion 430 of the flexible printed circuit 400, respectively.

The step S50 includes bending the flexible printed circuit 400 from another side of the contacting section 420 to form a third bend portion 440. In another words, before the third bend portion 440 is formed, the bending directions of the first hook 401 and the second hook 402 are respectively perpendicular to the extending direction of the flexible printed circuit 400.

The step S60 includes electrically connecting the flexible printed circuit 400 and the printed circuit board assembly 300. The circuit boards 300, 400 are soldered using the hot bar process. The flexible printed circuit 400 and the printed circuit board assembly 300 are combined and electrically connected via the first connecting unit 427 and the second connecting unit 327.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A complex circuit board fabrication method for combining a printed circuit board assembly (PCBA) with a flexible printed circuit (FPC), comprising the steps of:
    forming a first fixing portion on a connecting section of said printed circuit board assembly, a first connecting unit being disposed on the connecting section;
    forming a first fixing hole on a contacting section of said flexible printed circuit, said first fixing hole corresponding to said first fixing portion, a second connecting unit being disposed on the contacting section;
    inserting said first fixing portion of said printed circuit board assembly into said first fixing hole of said flexible printed circuit, and the first connecting unit facing and contacting the second connecting unit;
    bending said flexible printed circuit at said first fixing hole to form a first bend portion;
    bending said flexible printed circuit from another side of the contacting section to form a second bend portion; and
    electrically connecting said flexible printed circuit to said printed circuit board assembly by connecting the first connecting unit and the second connecting unit.

2. The complex circuit board fabrication method of claim 1, further comprising a step of forming a second fixing portion on the connecting section of said printed circuit board assembly.

3. The complex circuit board fabrication method of claim 2, further comprising a step of forming a second fixing hole on said flexible printed circuit to correspond to said second fixing portion.

4. The complex circuit board fabrication method of claim 3, further comprising a step of bending said flexible printed circuit at said second fixing hole to form a third bend portion.

5. The complex circuit board fabrication method of claim 1, wherein in said electrically connecting step, said first connecting unit of said printed circuit board assembly is electrically soldered to said second connecting unit of said flexible printed circuit using a hot bar process.

6. The complex circuit board fabrication method of claim 1, wherein the bending directions of said first bend portion and said second bend portion are parallel to the extending direction of said flexible printed circuit.

7. The complex circuit board fabrication method of claim 4, wherein the bending directions of said first bend portion and said third bend portion are substantially perpendicular to the extending direction of said flexible printed circuit.

8. The complex circuit board fabrication method of claim 3, further comprising a step of inserting said second fixing portion into said second fixing hole.

* * * * *